(12) United States Patent
Pohl et al.

(10) Patent No.: US 7,456,495 B2
(45) Date of Patent: Nov. 25, 2008

(54) SEMICONDUCTOR MODULE WITH A SEMICONDUCTOR STACK, AND METHODS FOR ITS PRODUCTION

(75) Inventors: Jens Pohl, Bernhardswald (DE); Bernd Roemer, Bernhardswald (DE); Bernhard Schaetzler, Regensburg (DE); Christian Stuempfl, Schwandorf (DE); Herman Vilsmeier, Karlsfeld (DE); Holger Woerner, Regensburg (DE); Bernhard Zuhr, Regensburg (DE)

(73) Assignee: Infineon Technologies AG, Munich (DE)

( * ) Notice: Subject to any disclaimer, the term of this patent is extended or adjusted under 35 U.S.C. 154(b) by 308 days.

(21) Appl. No.: 11/013,328

(22) Filed: Dec. 17, 2004

(65) Prior Publication Data
US 2005/0133932 A1    Jun. 23, 2005

(30) Foreign Application Priority Data
Dec. 19, 2003    (DE) ................... 103 60 708

(51) Int. Cl.
*H01L 23/02*    (2006.01)
(52) U.S. Cl. ............... 257/686; 257/777; 257/E23.085
(58) Field of Classification Search ............... 257/686, 257/723, 777
See application file for complete search history.

(56) References Cited

U.S. PATENT DOCUMENTS

| | | | |
|---|---|---|---|
| 6,828,665 B2* | 12/2004 | Pu et al. ................... | 257/686 |
| 6,861,288 B2* | 3/2005 | Shim et al. ................ | 438/109 |
| 7,049,692 B2* | 5/2006 | Nishimura et al. ......... | 257/686 |
| 7,102,892 B2* | 9/2006 | Kledzik et al. ............. | 361/770 |
| 2001/0054758 A1* | 12/2001 | Isaak ........................ | 257/686 |
| 2001/0054770 A1 | 12/2001 | Issak | |
| 2003/0038374 A1 | 2/2003 | Shim et al. | |
| 2003/0047798 A1* | 3/2003 | Halahan .................... | 257/685 |
| 2004/0124539 A1* | 7/2004 | Yang et al. ................. | 257/777 |
| 2004/0145039 A1 | 7/2004 | Shim et al. | |
| 2005/0046006 A1* | 3/2005 | Yeom ......................... | 257/686 |

FOREIGN PATENT DOCUMENTS

| | | |
|---|---|---|
| JP | 2002343930 A2 | 11/2002 |
| KR | 2000-56804 | 9/2000 |

\* cited by examiner

*Primary Examiner*—Phat X Cao
(74) *Attorney, Agent, or Firm*—Edell, Shapiro & Finnan, LLC

(57) ABSTRACT

An electronic semiconductor module component with a semiconductor stack includes semiconductor components arranged in a vertically stacked relationship. A basic semiconductor component includes a lower interposing unit, on which lower external contact pads are arranged. The basic semiconductor component further includes an upper interposing unit, on which upper external contact pads are arranged. The two interposing units are electrically connected to one another via bonding connections disposed at their edge areas. The basic semiconductor component is a compact component on which different, customer-specific semiconductor components can be stacked.

19 Claims, 16 Drawing Sheets

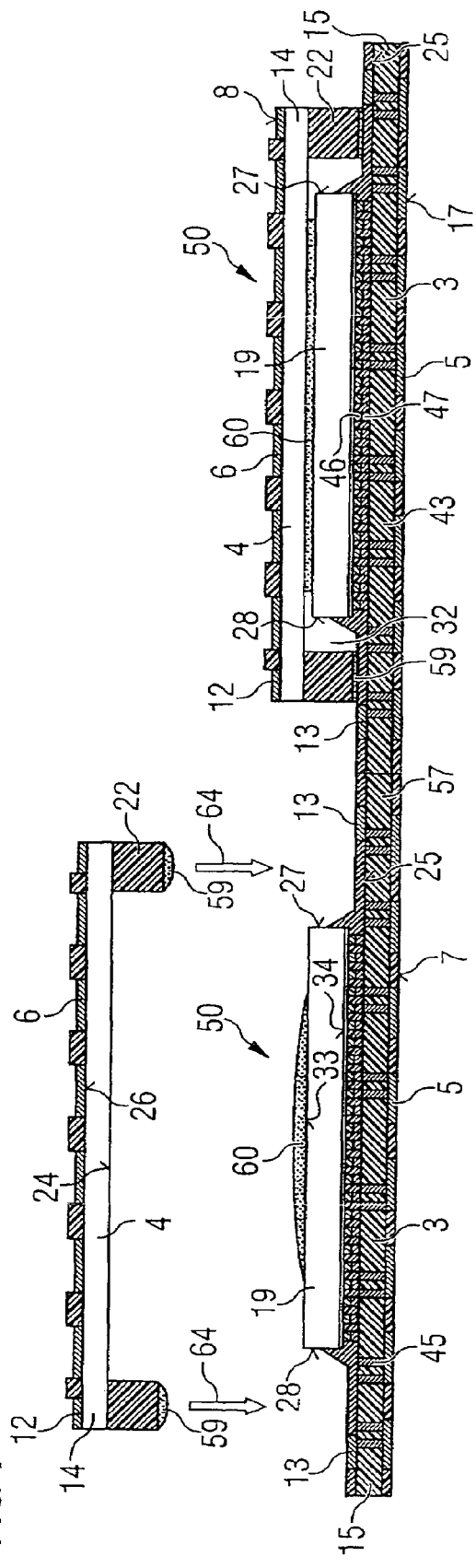
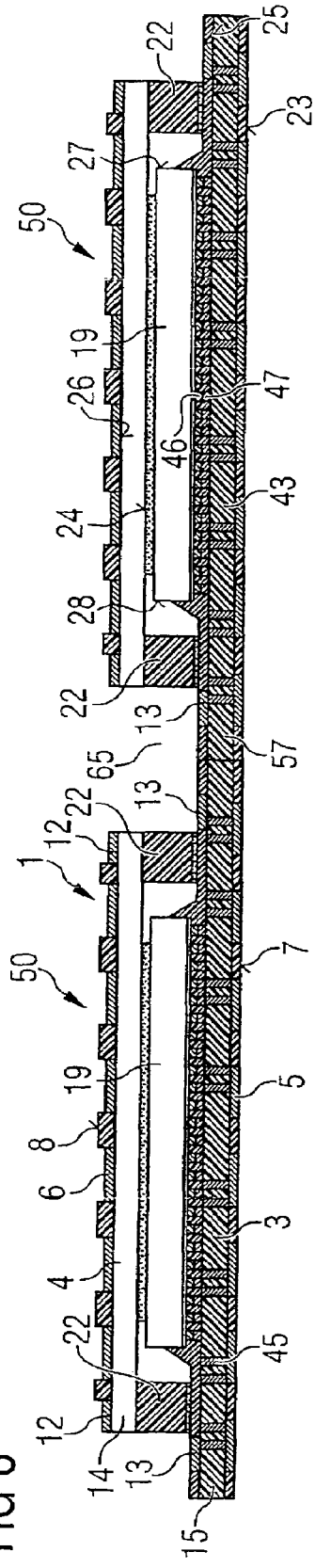
FIG 7
FIG 8

SEMICONDUCTOR MODULE WITH A SEMICONDUCTOR STACK, AND METHODS FOR ITS PRODUCTION

CROSS REFERENCE TO RELATED APPLICATIONS

This application claims priority under 35 USC §119 to German Application No. DE 103 60 708.0, filed on Dec. 19, 2003, and titled "Semiconductor Module with a Semiconductor Stack, and Methods for its Production," the entire contents of which are hereby incorporated by reference.

FIELD OF THE INVENTION

The invention relates to a semiconductor module with a semiconductor stack, and to methods for its production.

BACKGROUND

A semiconductor module such as the type described in U.S. Patent application Publication No. 2001/0054770 A1 and, for stacking purposes, uses a complex connecting frame and two additional basic layers, which each have a basic substrate and a wiring pattern. The connecting frame has vias from one of the basic substrates to the other basic substrate. Integrated semiconductor chips are electrically connected to the basic substrates and to their interposing patterns in such a way that a first semiconductor chip is partially surrounded by the connecting frame and the basic substrates, and a second semiconductor chip is mounted on the second basic substrate, with the complex connecting frame. In order to make it possible to provide the semiconductor stack with external contacts which are arranged such that they are flat, and thus to use the semiconductor module as a BGA (Ball Grid Array) component, a further substrate is provided in addition to the two basic substrates. This further substrate distributes the vias, which run vertically in the edge area of the module, in the two basic substrates and in the connecting frame such that they are flat on a lower surface of the further substrate.

One disadvantage of this known semiconductor module is the large number of at least three connecting interfaces between the three substrates and the connecting frame, which on the one hand must be adjusted with respect to one another and on the other hand must be electrically connected to one another, thus reducing the reliability of the known semiconductor module. A further disadvantage is that the height of the module cannot be reduced indefinitely, since three substrates and a connecting frame are required in order to stack two semiconductor chips one on top of the other, and this occupies a large amount of space.

SUMMARY OF THE INVENTION

One object of the invention is to overcome the previously noted disadvantages and to provide a reliable semiconductor module with a semiconductor stack, in which BGA or FBGA components with any desired flat external contact patterns can be stacked one on top of the other.

Another object of the invention is to reduce the complexity of stacked semiconductor components, and to improve their reliability.

The aforesaid objects are achieved individually and/or in combination, and it is not intended that the present invention be construed as requiring two or more of the objects to be combined unless expressly required by the claims attached hereto.

In accordance with the invention, a semiconductor module comprises a semiconductor stack, which includes semiconductor components arranged one above the other. This semiconductor module includes a basic semiconductor component with two interposing units. A lower interposing unit on a lower surface of the basic semiconductor component includes lower external contact pads, and an upper interposing unit on an upper surface of the basic semiconductor component includes upper external contact pads, and the external contact pads of the two interposing units are electrically connected via bonding connections between bonding surfaces disposed at the edge areas of the two interposing units. Furthermore, the external contact pads for the lower interposing unit include external contacts for the semiconductor module, and the external contact pads for the upper interposing unit are fit with external contacts of a stacked semiconductor component.

One advantage of this semiconductor module is that the basic component is physically compact and, on its lower surface, has an arrangement of external contact pads which, for example, can be matched to a matrix or to a grid size of a higher-level circuit board. In addition, one can fit further semiconductor components to the basic semiconductor component and to its upper external contact pads, with these further semiconductor components having a completely different arrangement of external contacts, thus making it possible to match the basic semiconductor component to any desired customer wishes. The basic semiconductor component may, for example, be a large-area memory semiconductor chip, which is controlled by a logic semiconductor component via the upper external contact pads.

The use of bonding connections to ensure the connection between the upper interposing unit and the lower interposing unit has the advantage that, on the one hand, a proven and known technology can be used to produce the connection and, on the other hand, that the bonding wires can be embedded in plastic by means of a reliable casting process. This plastic embedding at the same time also makes it possible to fill and seal all of the cavities which are not occupied by components of the semiconductor module, so that the basic semiconductor component is protected against the ingress of moisture and environmental loads. Only the upper external contact pads and the lower external contact pads are subject to the environment, as long as they are not covered by external contacts. A further advantage is that two or more basic semiconductor components can be produced at the same time and synchronously on one substrate for the lower interposing units, which allows mass production and considerably reduces the manufacturing costs for semiconductor modules such as these.

In one preferred embodiment of the invention, the basic semiconductor component has a semiconductor chip between the two interposing units. This semiconductor chip may electrically correspond to the lower interposing unit, and may advantageously be fit with the upper interposing unit. This upper interposing unit may be adhesively bonded directly on the semiconductor chip, or may be mechanically connected to the upper interposing unit via a large-area plastic compound. The lower interposing unit means that the semiconductor chip can correspond with the lower interposing units via flipchip contacts or via semiconductor chip bonding connections.

A further embodiment of the invention provides for a spacer, which forms a housing, for the basic semiconductor component to be provided between the two interposing units. This spacer is cast on one lower surface of the upper interposing unit, and is firmly adhesively bonded to an upper surface on the lower interposing unit. A spacer such as this has the advantage that the upper interposing unit is supported during the bonding connection to the lower interposing unit, with the spacer particularly being arranged, forming a housing, on edge areas of the upper interposing unit, which edge areas also have bonding surfaces for the connection for the lower interposing unit.

A further advantage of the spacer is that it does not have any electrical function, as in the case of a via or of extended interposing, so that it can be produced in a simple manner by casting without any complex technology being required for its production. Furthermore, the height of the spacer can be matched to the thickness of the semiconductor chip of the basic semiconductor component, and can surround it completely. This results in a hollow housing, or cavities aligned only parallel to the edges of the semiconductor chip. The space between the spacers and the semiconductor chip can be filled with a plastic housing compound. For radio-frequency applications, it may be advantageous for the semiconductor chip to be kept completely free of plastic compound, except for its electrical connections for the lower interposing unit.

A further embodiment of the invention provides for the basic component to have a semiconductor chip between the two interposing units, the rear face of such semiconductor chip being arranged on the lower interposing unit, while its contact pads on its active upper surface are electrically connected via bonding connections to bonding surfaces of an interposing structure on the upper surface of the lower interposing unit. In this embodiment of the invention, the bonding connections (which are required here for the electrical connection between the semiconductor chip and the lower interposing unit) are embedded in a plastic housing. The upper surface of this plastic housing can then be fit with the upper interposing unit of the basic semiconductor component. This embodiment of the invention has the advantage that the basic component can be assembled in the form of a plurality of components, with a complete semiconductor component first of all forming the basis of the basic semiconductor component, and only a further interposing unit being fit to the rear face of this functional semiconductor component. This application of the invention thus also allows a standard component to be used, to which an interposing unit is also fit. This interposing unit is electrically connected via bonding connections on the edge faces to the external contact pads on the lower surface of the basic semiconductor component, and to the contact pads on the semiconductor chip in the interior of the semiconductor component.

One general advantage of the idea of the invention is that, if the stacked semiconductor component malfunctions, this semiconductor component can be removed from the basic component. It can then be easily replaced during maintenance or repair work by a serviceable, stacked semiconductor component.

In order to achieve a reliable connection between the semiconductor chip in the basic component and the external contact pads on the lower surface of the semiconductor module, the lower interposing unit has an insulating mounting board. An interposing structure is arranged on the upper surface of this insulating mounting board. On its edge faces, this interposing structure has bonding surfaces for the bonding connections for the semiconductor chip. The lower interposing unit furthermore has vias in the mounting board, which extend underneath the rear face of the semiconductor chip and are connected to the bonding surfaces via interposing lines underneath the rear face of the semiconductor chip. These vias are themselves electrically connected to the external contact pads of the lower interposing unit. In this embodiment of the lower interposing unit, the interfaces between the lower external contact pads and contact surfaces on the semiconductor chip are reduced to a minimum.

A further possible way to improve the reliability of the basic semiconductor component can be achieved by the basic component having a semiconductor chip with flipchip contacts between the two interposing units. These flipchip contacts, which have a size of a few micrometres, are electrically connected to contact connecting pads, which have a size of a few micrometres in a corresponding manner, of an interposing structure on an upper surface of the lower interposing unit. This lower interposing structure has additional interposing lines on the one hand to bonding surfaces on the edge faces of the lower interposing unit, and to vias through the mounting board for the interposing unit. The vias are themselves in turn electrically connected to the external contact pads on the lower interposing unit. The use of a semiconductor chip with flipchip contacts reduces the interface to the lower interposing unit to a single item. This further improves the reliability of the basic semiconductor component, and contributes to the compactness of the basic semiconductor component.

The manufacture of a semiconductor module such as described above is improved by one particular refinement of an interposing board with two or more interposing positions, which are arranged in rows and columns, in which case upper interposing units can then be cut out from one such interposing board. For this purpose, the interposing board has metallic interposing structures with external contact pads on an upper surface, for corresponding upper interposing units. On a lower surface opposite the upper surface, the interposing board has a spacing structure, which forms a housing, in the interposing positions, which spacing structure has cast-on, raised ribs, or represents raised grid structures. This cast-on grid structure and/or these cast-on ribs is or are arranged in the edge areas of the interposing positions and forms or form a spacer or spacers on the lower surface of the upper interposing unit when the interposing board is cut apart.

One method for production of an upper interposing unit for a basic semiconductor component of a semiconductor module has the following method steps. An upper interposing unit such as this is advantageously produced from a larger interposing board with two or more interposing positions, with the interposing positions being arranged in rows and columns. For this purpose, a mounting board which is coated with metal on an upper surface is produced in a first step. The metal coating on this mounting board is then structured to form interposing structures in the interposing positions with external contact pads and interposing lines to bonding surfaces, which are arranged in edge areas of the interposing positions. A spacing structure, which forms a housing and is composed of cast, raised ribs and/or of a raised grid structure, is then fit on a lower surface, opposite the upper surface. The rib and/or grid structure or structures is or are structured as a spacer or spacers forming a housing or housings and is or are arranged in edge areas of the interposing positions such that the rib and/or grid structure or structures represent structuring of the lower surface of the spacing structure, which form a housing or housings, when this interposing board is cut up to form upper interposing units for a basic semiconductor component of a semiconductor module.

A rib or grid structure such as this for the spacers on the lower surface of the interposing board can be produced by diecasting or injection moulding of a plastic housing compound onto the lower surface of the mounting board. Processes such as these for structuring the lower surface of the mounting board are cost-effective and can be used for mass production.

One method for production of basic semiconductor components for semiconductor modules according to the invention also has the following method steps. First of all, upper interposing units are produced, as described above. Furthermore, a lower interposing board is produced with two or more semiconductor module positions, and which has interposing structures on its upper surface, and external contact pads in the semiconductor module positions on its lower surface. This lower interposing board with two or more semiconductor module positions forms the basis for the basic semiconductor components, which are arranged in rows and columns.

Semiconductor chips are then fit in the semiconductor module positions to the upper surface of the lower interposing board. During or after the fitting of the semiconductor chips, they are electrically connected, in the semiconductor module positions, to the corresponding interposing structures of the lower interposing board. The upper interposing units mentioned above are then adhesively bonded by their spacers to the lower interposing board, with the spacing structure or structures, which forms a housing or housings on the upper interposing units being adhesively bonded onto the upper surface of the lower interposing board, with the semiconductor chips being surrounded by spacers which form a housing or housings. After this step, the upper interposing unit and the lower interposing unit are produced by production of bonding connections between the two units in the semiconductor module positions. The bonding connections are then embedded in a plastic housing compound and, finally, the lower interposing board can be cut up at the semiconductor module positions to form basic semiconductor components.

This method has the advantage that proven techniques, which can be coped with technically, for connection of a specific upper interposing unit can be reliably linked to an appropriately prepared lower interposing unit. Furthermore, the upper interposing unit is supported by the spacers during the production of the bonding connections, so that the fault rate during the production of bonding connections is also minimized. The filling of the spaces between the semiconductor components with a plastic housing compound at the same time embeds the bonding connections in the plastic housing compound, and thus protects this sensitive connection area between the upper and lower interposing unit.

In order to produce semiconductor modules, the lower interposing board, as described above, can first be cut up into basic semiconductor components (after it has been fit with semiconductor chips and upper interposing units, and after the bonding connections have been produced and the plastic housing compound has been applied), and stacked semiconductor components can be fit onto these basic semiconductor components. For this purpose, the external contacts of the stacked semiconductor components are connected to the upper external contact pads on the basic semiconductor component.

If the basic semiconductor component still has no lower external contacts, these can be fit together with the fitting of the stacked semiconductor component to the basic component. A further option is to fit the lower external contacts to the lower surface of the lower interposing board, which has not yet been separated, before it is cut up. This option is dependent on the separation technique that is used, for example a sawing technique.

Thus, the invention solves the technical problems relating to stacking of at least two semiconductor components by the use of an intermediate board or an upper interposing unit, which is connected to a lower interposing unit via wire bonds.

The above and still further objects, features and advantages of the present invention will become apparent upon consideration of the following detailed description of specific embodiments thereof, particularly when taken in conjunction with the accompanying drawings, where like numerals designate like components.

BRIEF DESCRIPTION OF THE DRAWINGS

FIG. 7 shows a schematic cross-sectional view of a lower interposing board before and after an upper interposing unit with a spacer has been adhesively bonded on the lower interposing board in accordance with the invention;

FIG. 8 shows a schematic cross-sectional view of a lower interposing board with semiconductor chips fit and with upper interposing units adhesively bonded on the lower interposing board in accordance with the invention;

DETAILED DESCRIPTION

Figure 1:
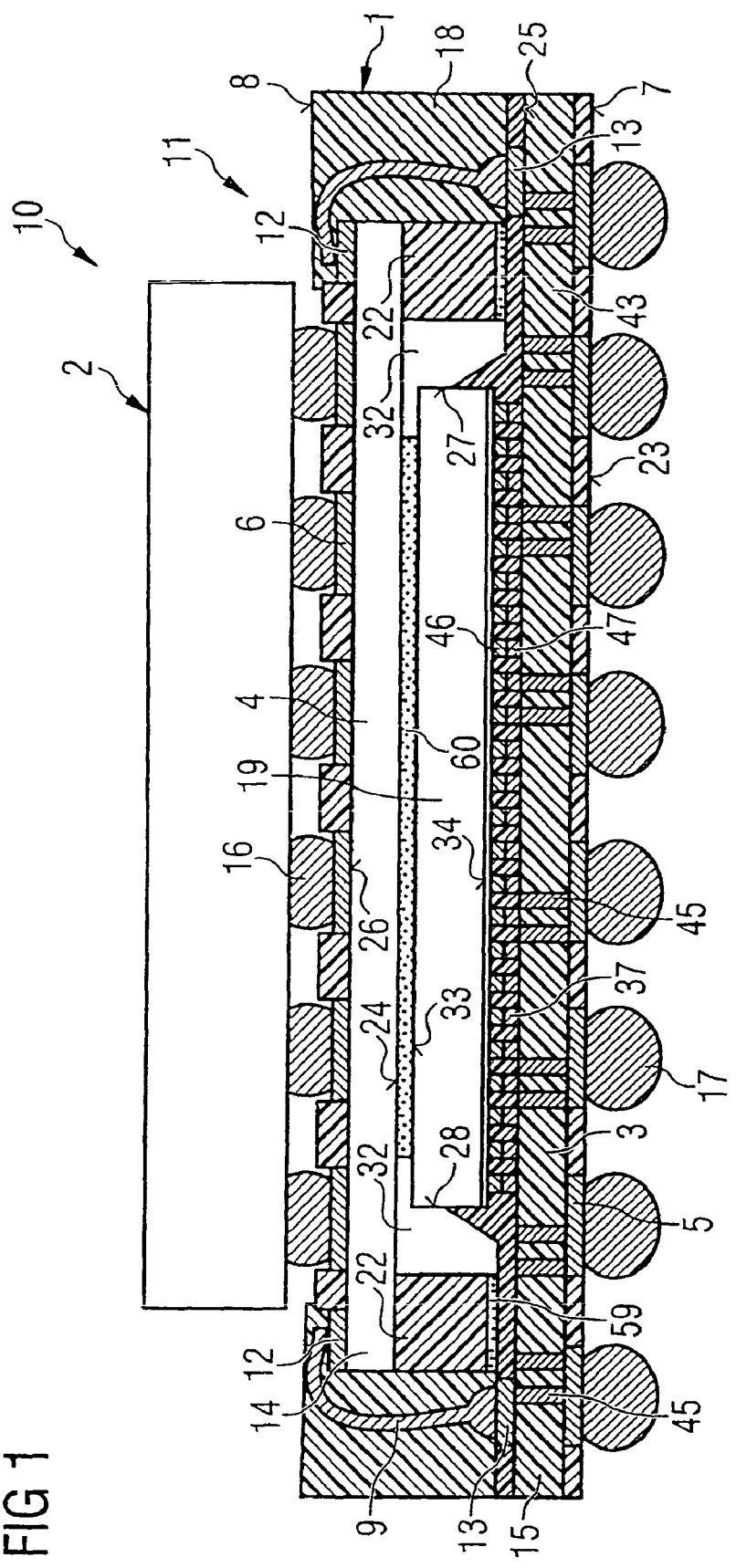
FIG. 1 shows a schematic cross-sectional view of a semiconductor module with a semiconductor stack in accordance with a first embodiment of the invention.

FIG. 1 shows a schematic cross-sectional view of a semiconductor module 10 with a semiconductor stack 11, according to a first embodiment of the invention. This first variant of the invention uses a so-called interposer as the upper interposing unit 4 with moulded spacers 22. This variant is preferably used for a basic component 1 with a semiconductor chip 19 which has flipchip contacts 46. The flipchip contacts 46 are fit to contact connecting pads 47 on a lower interposing unit 3. Semiconductor chips 19 such as these with flipchip contacts 46 have a smaller area than the area which is required for the upper interposing unit 4, or for an interposer. The spacers 22 are used to support the areas in which a wire bond must be passed through, thus allowing a reliable bonding process. After wire bonding, the bonding channels are closed by means of an encapsulating process by means of moulding or dispensing, with the bonding connections 9 being embedded. This configuration, as is shown in FIG. 1, may also be produced by moulding or casting the spacers 22 on the lower interposing unit 3 of the basic semiconductor component 1, rather than on the upper interposing unit 4.

As is shown in FIG. 1, the spacers 22 for the upper interposing unit 4 are fixed by means of an adhesive layer 59 on the lower interposing unit 3. The lower surface 24 of the upper interposing unit 4 is optionally connected to the semiconductor chip 19 via an adhesive layer 60.

In this first embodiment of the invention as shown in FIG. 1, the semiconductor chip 19 is completely surrounded by the spacer 22 between the lower interposing unit 3 and the upper interposing unit 4, so that a cavity 32 is formed in the edge area between the semiconductor chip and the spacer. A plastic compound 18 forms a housing and embeds the bonding connections 9. However, the plastic compound 18 does not fill cavity 32, because the semiconductor chip 19 is completely surrounded by the spacer 22.

The semiconductor module illustrated in FIG. 1 includes a compact basic semiconductor component 1 with a lower surface 7 and an upper surface 8, with a stacked semiconductor component 2 being fit on top of the upper surface 8. External contacts 17 of the semiconductor module 10 are soldered, in the form of solder balls, to lower external contact pads 5 on the lower surface 23 of the lower interposing unit 3. The upper external contact pads 6 on the upper interposing unit 4 of the basic semiconductor component 1 can be arranged on a customer-specific basis and, particularly, the design of the lower interposing unit 3 and of the upper interposing unit 4 may be designed completely independently of one another.

The electrical connection between the semiconductor chip 19 for the basic semiconductor component 1 and the external contacts of the stacked semiconductor component 2 passes via the following interfaces and contacts: first of all via the flipchip contacts 46 on the semiconductor chip 19, then via contact connecting pads 47 on an interposing structure of the lower interposing unit 3. This interposing structure may have interconnects, which lead to vias 45 in the lower interposing unit 3, and correspond with the lower external contact pads 5 on the lower interposing unit 3.

At the same time, interposing lines on the upper surface 25 of the lower interposing unit 3 lead from the flipchip contacts 46 to bonding surfaces 13 on the lower interposing unit 3. These bonding surfaces 13 are arranged on the upper surface 25 in the edge areas 15 of the lower interposing unit 3, so that electrical connections exist via bonding connections 9 to the bonding surfaces 12 on the upper interposing unit 4. These bonding surfaces are in turn connected to the upper external contact pads 6 via an interposing structure (which cannot be seen) on the upper surface 26 of the upper interposing unit 4. This ensures that there are electrical connections from the flipchip contacts 46 on the semiconductor chip 19 both for the external contacts 17 on the lower surface of the first semiconductor component 1 and for the external contacts 16 on the stacked semiconductor component 2.

With regard to the variant 1 or the first embodiment of the invention as shown in FIG. 1, it should also be noted that the production of the spacers 22 is an extremely low-cost variant, owing to the moulding process, in which a grid composed of pressed compound is first of all moulded onto an interposing board or onto an interposer substrate strip. Once this has been done, the interposer substrates and the upper interposing units are then separated (e.g., by sawing).

Figure 2:
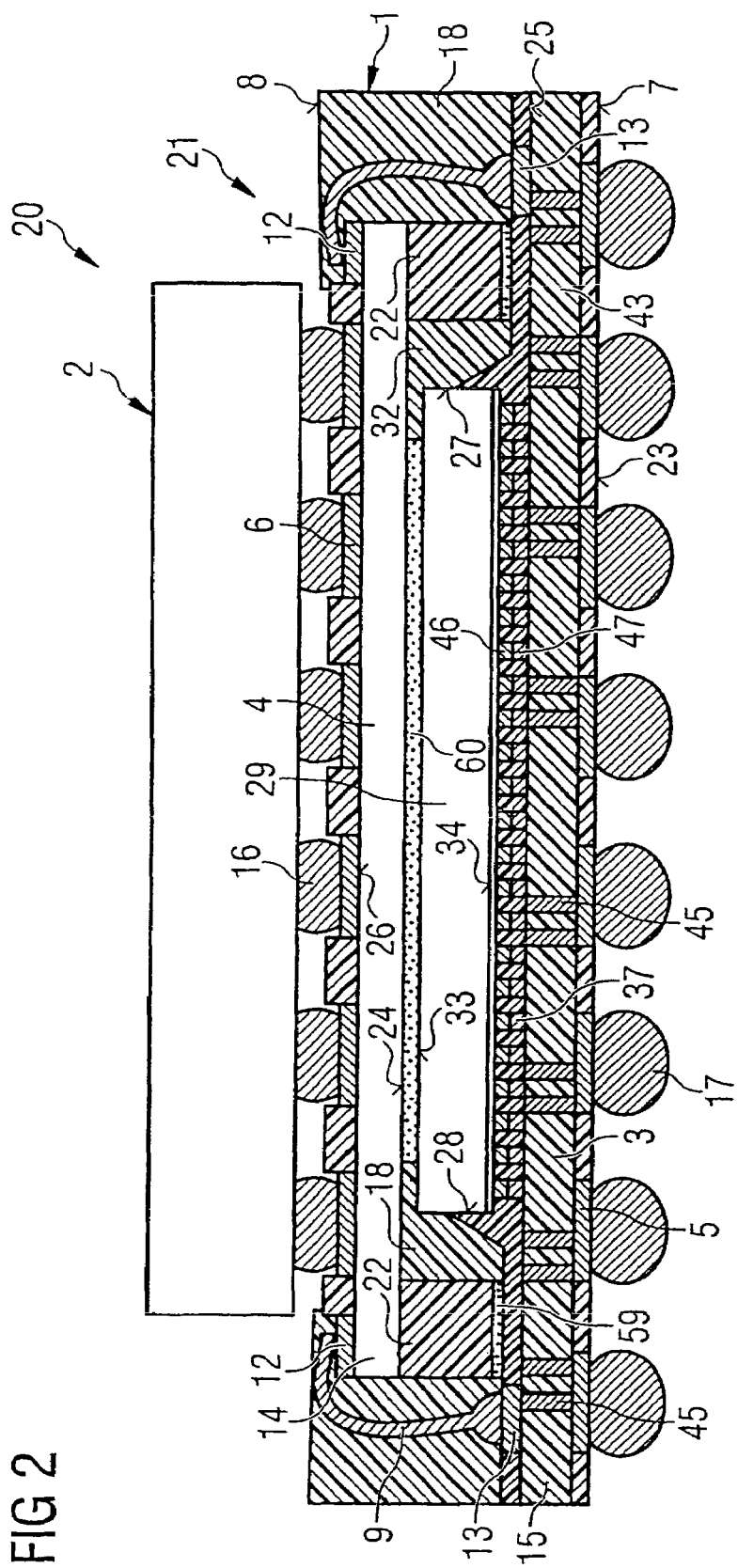
FIG. 2 shows a schematic cross-sectional view of a semiconductor module with a semiconductor stack in accordance with a second embodiment of the invention.

FIG. 2 shows a schematic cross-sectional view of a semiconductor module 20 with a semiconductor stack 21 according to a second embodiment of the invention.

Components with the same functions are identified by the same reference symbols as in FIG. 1, and will not be explained again.

This second embodiment or second variant is similar to the first embodiment. However, in the second embodiment, not only are the channels with the bonding wires located in them encapsulated, with the bonding connections 9 thus being embedded in a plastic housing compound 18, but the cavities 32, as can also be seen in FIG. 1, underneath the upper interposing board are also filled with the encapsulation compound, such as a plastic housing compound 18. This is achieved by the spacer 22 not completely surrounding the semiconductor chip 29 of the basic semiconductor component 1 but, in fact, being arranged only on the two opposite edge faces of the semiconductor chips 27 and 28, so that the plastic housing compound 18 can penetrate from the other edge faces, which are not shown here, into the cavities, and can fill them.

If the lower interposing unit 3 has a thickness of 100 to 150 micrometres and the upper interposing unit has a thickness of 80 to 130 micrometres, with the semiconductor chip 29 having a thickness of between 70 and 120 micrometres, this results in the basic semiconductor component 1 having an overall thickness or overall height of between 250 and 400 micrometres.

Figure 3:
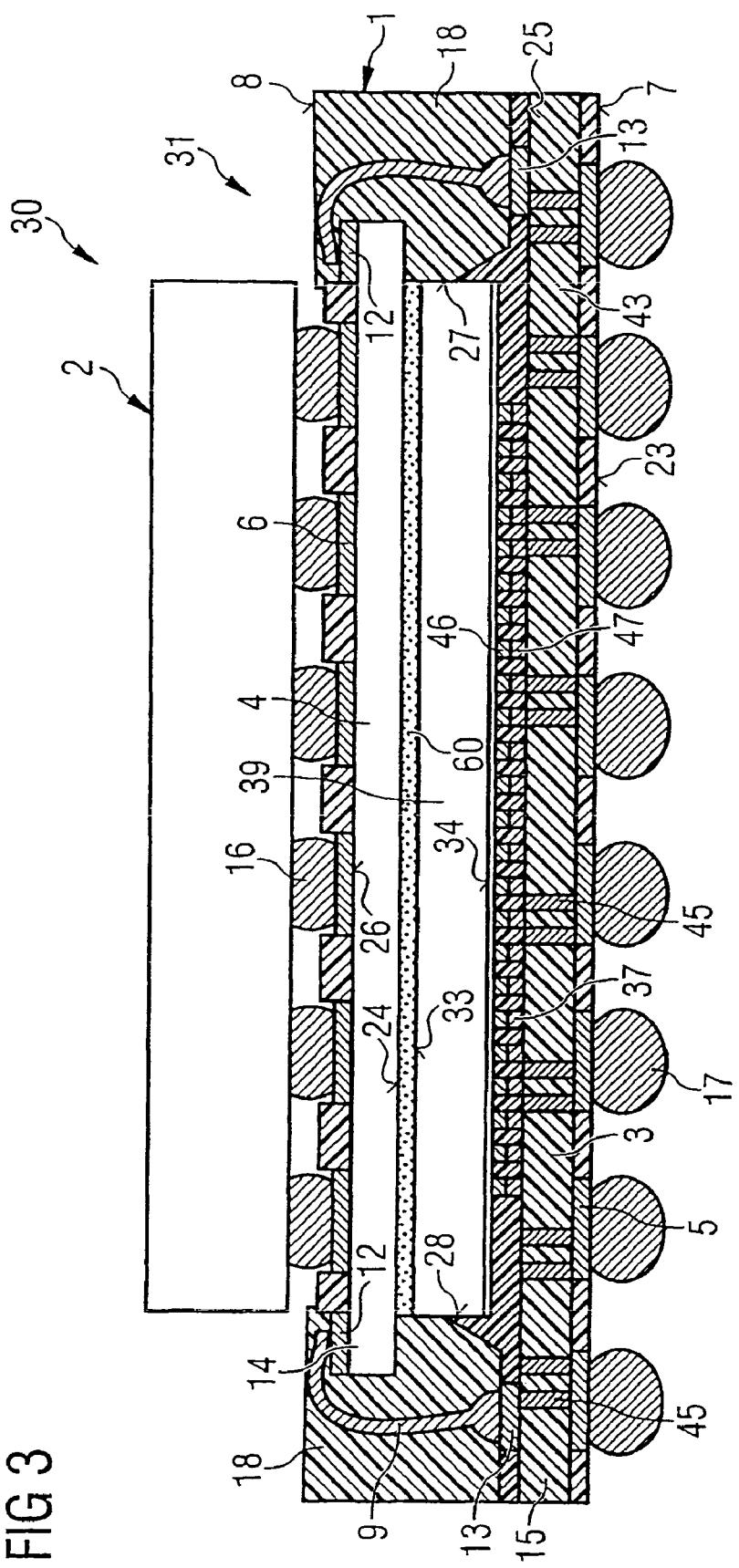
FIG. 3 shows a schematic cross-sectional view of a semiconductor module with a semiconductor stack in accordance with a third embodiment of the invention.

FIG. 3 shows a schematic cross-sectional view of a semiconductor module 30 with a semiconductor stack 31, according to a third embodiment of the invention. Components with the same functions as in FIG. 1 are identified by the same reference symbols, and will not be explained again.

In this third variant or third embodiment of the invention as depicted in FIG. 3, an upper interposing unit 4 or else an interposer is used without any further spacers (e.g., without spacers 22 as depicted in the embodiments of FIGS. 1 and 2). This variant may be used when the upper interposing unit 4 has a surface which corresponds approximately to the semiconductor chip 39 between the upper interposing unit 4 and the lower interposing unit 3.

In this case, the forces which occur during production of the bonding connections 9 are absorbed in a supporting manner by the semiconductor chip 39 itself, so that the semiconductor chip 39 contributes to making the edge areas 14 of the upper interposing unit 4 (which have the bonding surfaces 12) stable during the bonding process. The plastic compound 18 which is introduced into the bonding channels of the lower interposing unit at the same time fills all the spaces between the upper interposing unit 4 and the lower interposing unit 3, thus resulting in a compact basic semiconductor component 1. The connection technique between the flipchip contacts 46 on the semiconductor chip 39 and the upper external contacts 16 of the stacked semiconductor component 2 is such that they are connected to one another in the same manner via two corresponding interposing structures on the lower and upper interposing units 3 and 4.

Figure 4:
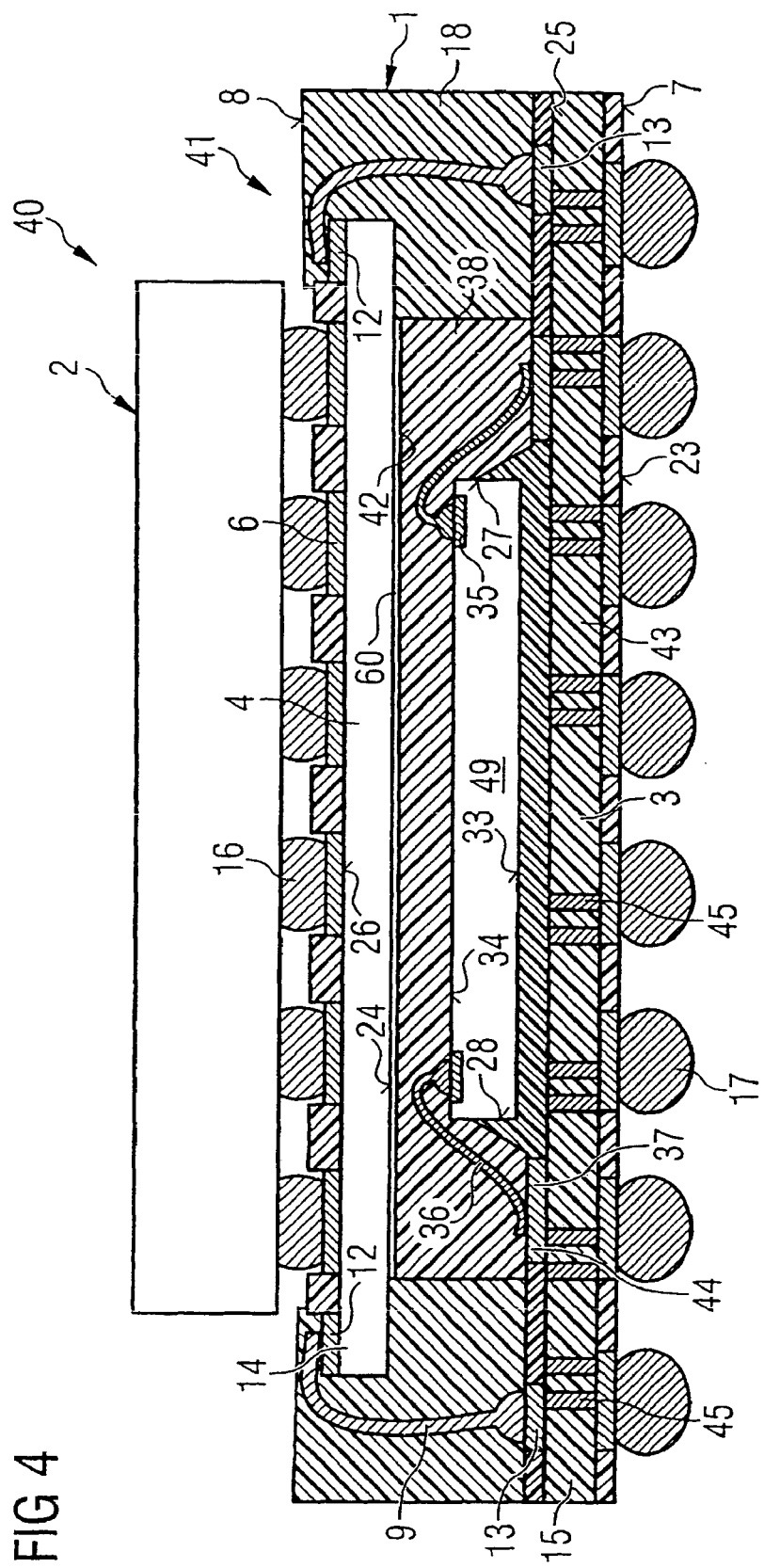
FIG. 4 shows a schematic cross-sectional view of a semiconductor module with a semiconductor stack in accordance with a fourth embodiment of the invention.

FIG. 4 shows a schematic cross-sectional view of a semiconductor module 40 with a semiconductor stack 41, according to a fourth embodiment of the invention. Components having the same functions as in the previous figures are identified by the same reference symbols, and will not be explained again.

The fourth embodiment of the invention represents a variant in which a plastic housing 38 is provided within the basic semiconductor component 1 in order to encapsulate a semiconductor chip 49 in the basic semiconductor component 1. An upper interposing unit 4 is fit to the upper surface 42 of this plastic housing 38. A further difference between the fourth embodiment of the invention as shown in FIG. 4 and the previous embodiments is that the semiconductor chip 49 is adhesively bonded by its rear face to the lower interposing unit 3, while its active upper surface 34 is connected by means of the contact pads 35 via additional bonding connections 36 within the plastic housing 38 to corresponding bonding surfaces 44 on the interposing structure 37 on the upper surface 25 of the lower interposing unit 3.

These bonding surfaces 44 are also included in the plastic housing 38. This variant of the invention accordingly has wire-bonded semiconductor chips in a plastic housing 38 for the basic semiconductor component 1, although it is also possible to use flipchip contacts instead of wire-bonded semiconductor chips. In the case of flipchip contacts, the active upper surface 34 is aligned with respect to the lower interposing unit 3 as is shown in FIGS. 1 to 3. An adhesive layer 60 is arranged between the plastic housing 38 for the semiconductor chip 49 and the upper interposing unit 4, and fixes the upper interposing unit 4 on the plastic housing 38. The area extent of the plastic housing 38 is chosen such that it corresponds to the area of the upper interposing unit 4.

Figure 5:
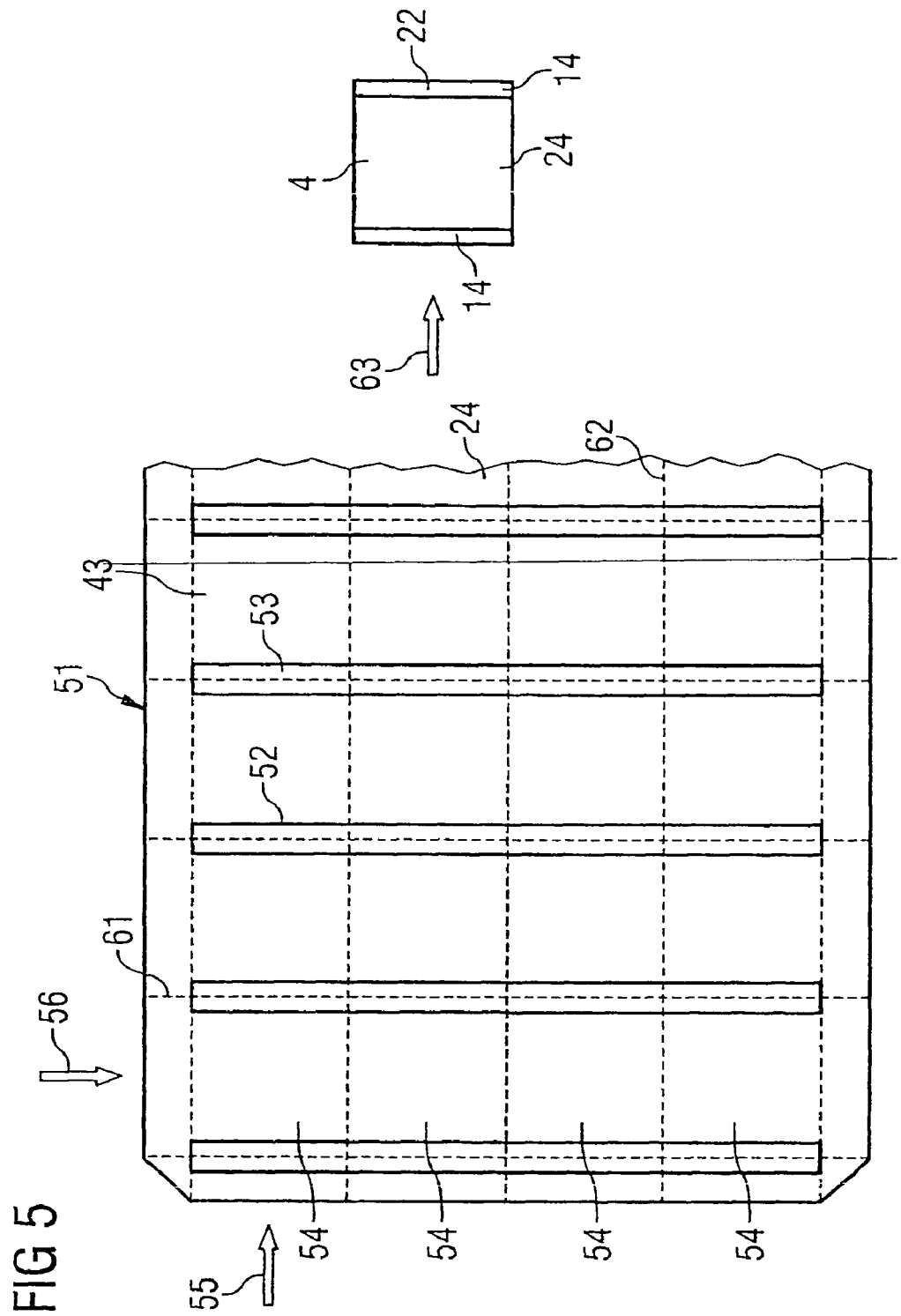
FIG. 5 shows a schematic view in plan of a lower surface of an interposing board for an upper interposing unit with a first spacing structure in accordance with the invention.

FIG. 5 shows a schematic view in plan of a lower surface or lower surface 24 of an interposing board 51, where the board 51 includes an insulating mounting board 43 for an upper interposing unit 4 with a first spacing structure 52. Interposing positions are arranged in rows 55 and columns 56 on the lower surface 24 of the interposing board 51. The actual interposing structure in each of the interposing positions 54 is arranged on the upper surface, which is not shown here, of the interposing board 51 in the interposing positions 54. Ribs are moulded as a first spacing structure 52 onto the lower surface 24 of the interposing board 51 and are cast onto the edge faces of the respective interposing positions along the columns 56. When the interposing board 51 is being cut up along the vertical separating tracks 61 and horizontal separating tracks 62, this results in upper interposing units, of which a single interposing unit 4 is shown to the right of the indication arrow 63.

The cutting process results in the projections, which are fit in the form of ribs 53, being formed as spacers 22 at the edges. These spacers 22 are arranged on two opposite edge areas 14 of the upper interposing unit 4, so that the lower surface 24 remains free of any projection and can hold a semiconductor chip, thus allowing the plastic housing compound to penetrate between the semiconductor chip (which is not shown here) and the upper interposing unit 4 via the edge areas in which there is no spacer 22.

Figure 6:
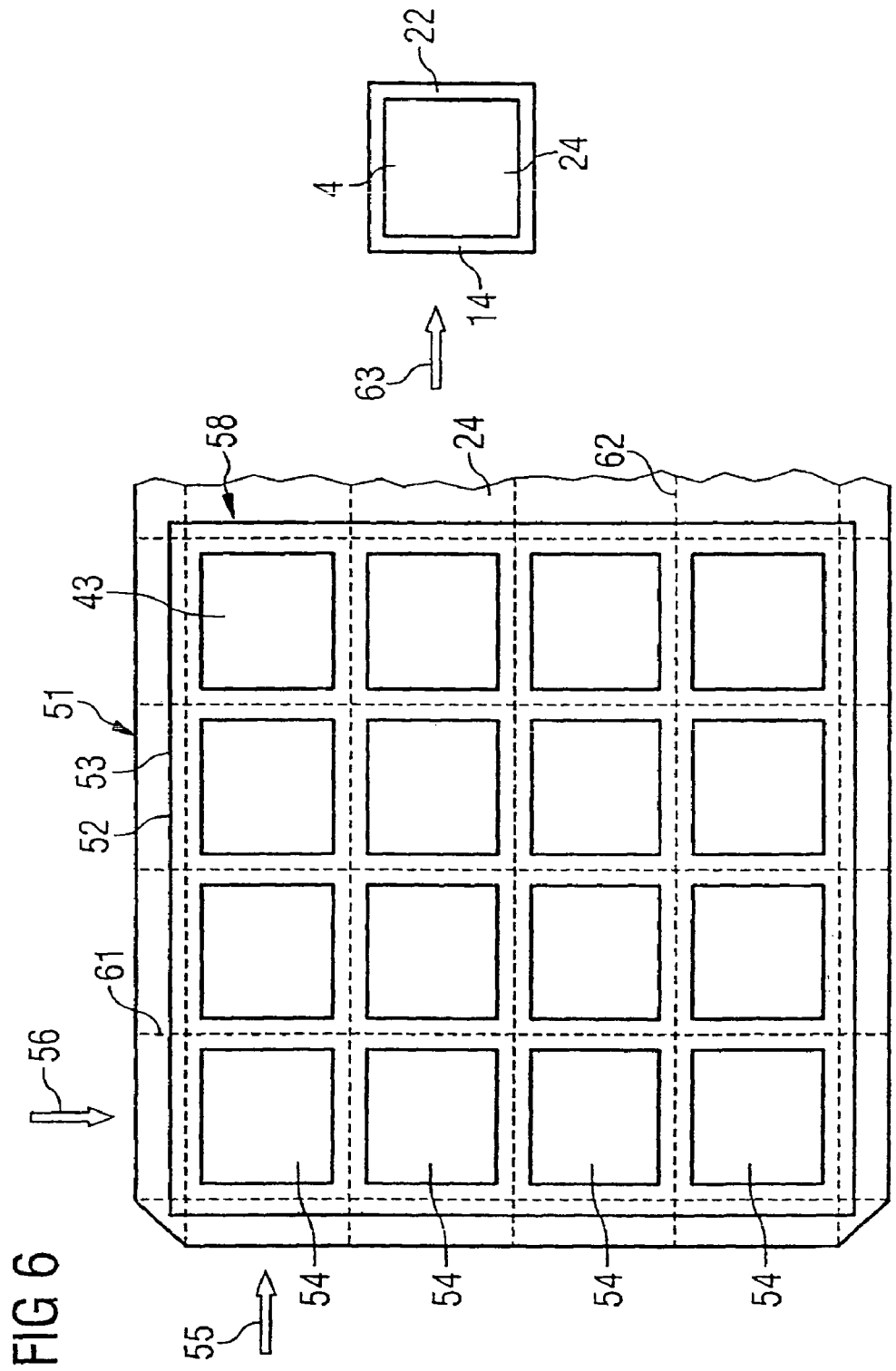
FIG. 6 shows a schematic view in plan of a lower surface of an interposing board for an upper interposing unit with a second spacing structure in accordance with the invention.

FIG. 6 shows a schematic view in plan of a lower surface 24 of an interposing board 51 including an insulating mounting board 43 for an upper interposing unit 4 with a second spacing structure 52. This second spacing structure 52 is in the form of a grid, with the cast-on plastic structures which form the spacers forming a grid structure 58. The grid structure 58 covers all four corner areas of a lower surface 24 of a sawn-out upper interposing unit 4. When an upper interposing unit 4 of this type is placed, as is illustrated by the direction of the indication arrow 63, over a semiconductor chip, then cavities are formed which cannot be filled with the plastic housing compound. An upper interposing unit 4 such as this is therefore suitable for the formation of cavity housings which are suitable for radio-frequency applications.

FIG. 7 shows a schematic cross-sectional view of a lower interposing board 57.

An upper interposing unit 4 with spacers 22 is arranged above the lower interposing board 57 in the left-hand half of the figure, and is lowered in the direction of the arrow 64. For this purpose, the spacer has an adhesive layer 59, by means of which the upper interposing unit 4 and the spacer 22 can be fixed on the upper surface 25 of the lower interposing unit 3. Furthermore, an adhesive layer 60 is arranged on the rear face 33 of the semiconductor chip 19 and ensures that the upper interposing unit 4 can be fixed on the semiconductor chip 19.

The right-hand half of the figure shows the upper interposing unit 4, which is recessed in the direction of the arrow 64, onto the interposing board 57. During this fitting process, the adhesive layers 59 and 60 are deformed and ensure that the upper interposing unit 4 is firmly seated on the lower interposing board 57. In this case, the spacers 22 completely surround the semiconductor chip 19, so that a cavity 32 remains when the plastic housing compound is introduced.

FIG. 8 shows a schematic cross-sectional view of a lower interposing board 57 with semiconductor chips 19 fit and with an adhesively bonded upper interposing unit 4. FIG. 8 corresponds to FIG. 7 once the upper interposing units 4 have been arranged above the respective semiconductor chip 19 in the two semiconductor module positions 50. Semiconductor module positions 50 such as these are arranged in rows and columns on the interposing board 57, with a bonding channel 65 remaining between the upper interposing units 4, which channel has bonding surfaces 13 on the lower interposing board 57, and has bonding surfaces 12 at the edge of the bonding channel 65 on the upper interposing units 4.

Figure 9:
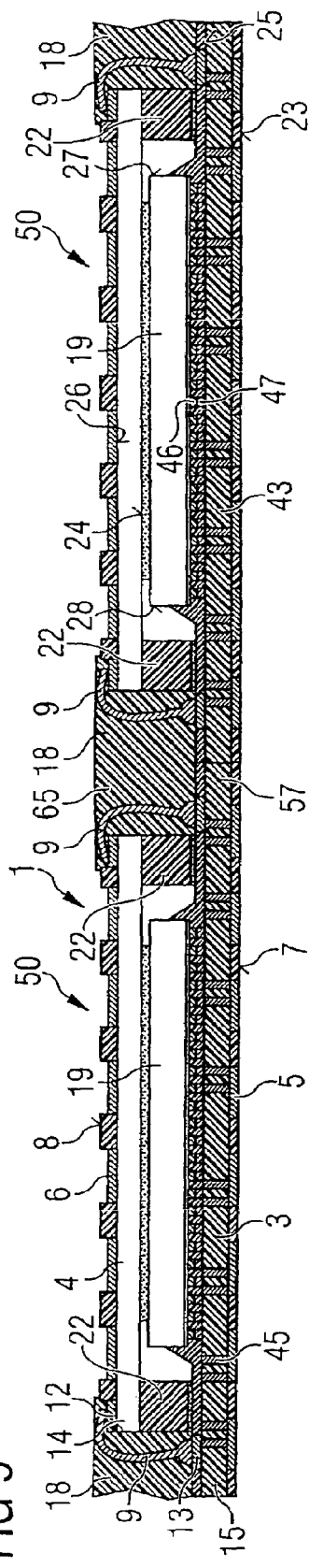
FIG. 9 shows a schematic cross-sectional view of the lower interposing board of FIG. 8, with bonding connections fit and embedded in a plastic housing compound.

FIG. 9 shows a schematic cross-sectional view of a lower interposing board 57 as shown in FIG. 8 with bonding connections 9 fit, which are embedded in a plastic housing compound 18. For this purpose, the bonding connections 9 between the bonding surfaces 13 on the lower interposing board 57 and the bonding surfaces 12 on the upper interposing unit 4 were first of all produced along the bonding channel 65, and the bonding channel 65 was then filled with plastic housing compound 18. The bonding channels 65, in which the bonding connections 9 are located, are filled with an epoxy compound by way of example during a dispense or mould process, in order to protect the bonding wires of the bonding connections 9.

Figure 10:
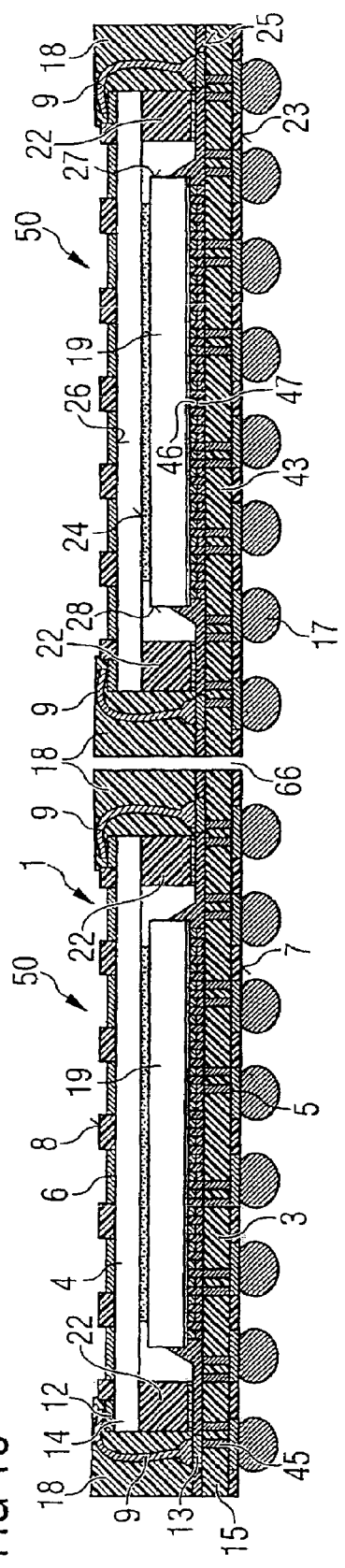
FIG. 10 shows a schematic cross-sectional view of two basic components, after the lower interposing board as shown in FIG. 9 has been cut up in accordance with the invention.

FIG. 10 shows a schematic cross-sectional view of two basic semiconductor components 1, after the lower interposing board 57 as depicted in FIG. 9 has been cut up into two separate components. For this purpose, the separating joints 66 are placed along the rows and columns of the semiconductor module positions 50, once appropriate solder balls have been fit, as lower external contacts 17, to the lower external contact pads 5 shown in FIG. 9.

Figure 11:
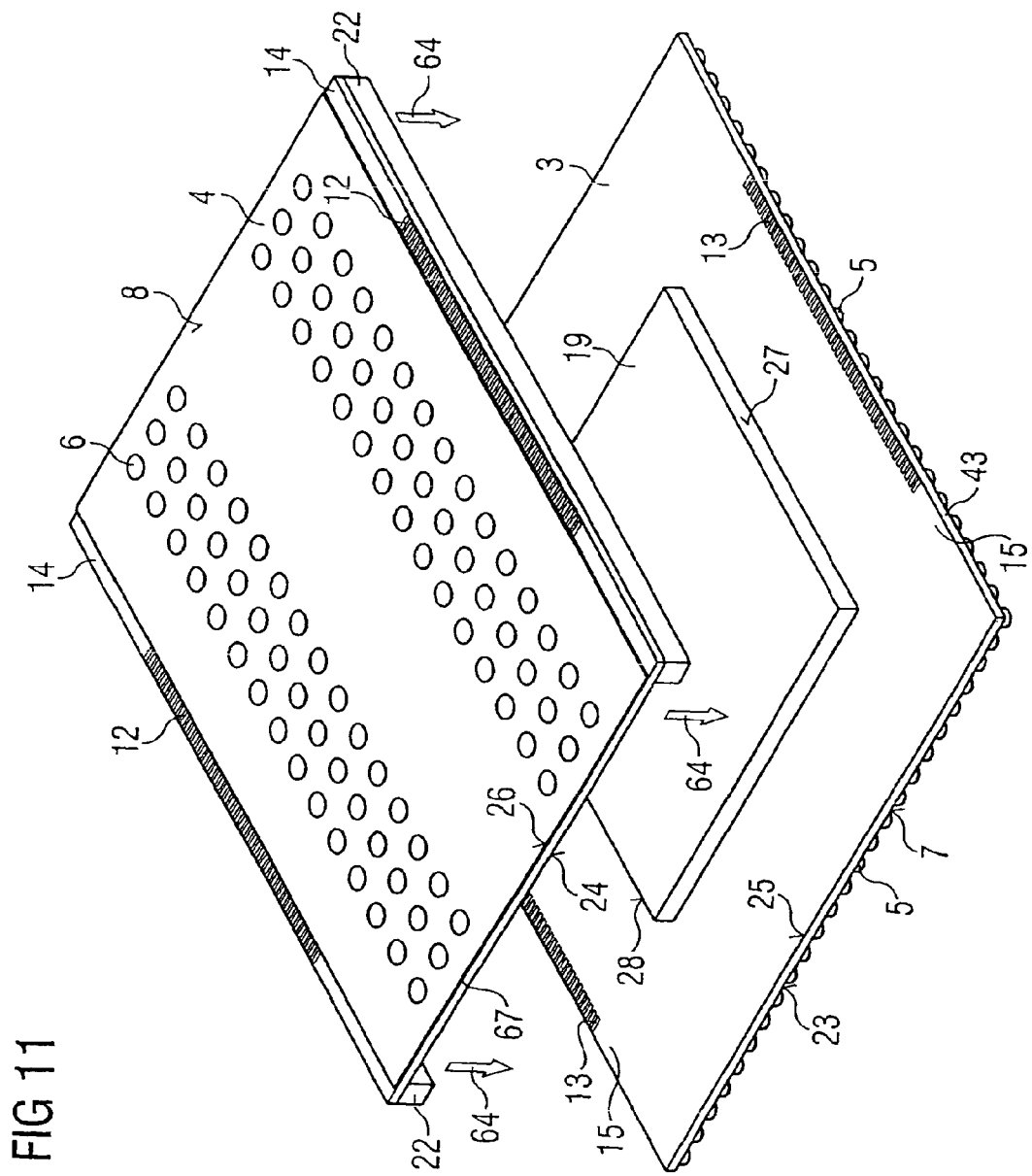
FIG. 11 shows a schematic and exploded view in perspective of a basic semiconductor component according to the second embodiment of the invention, as is illustrated in FIG. 2.

FIG. 11 shows a schematic, exploded view in perspective of a basic semiconductor component 1 according to the second embodiment of the invention, as is illustrated in FIG. 2. The following items can be seen, from top to bottom. First of all, FIG. 11 shows the upper interposing unit 4 with bonding surfaces 12, in edge areas 14 of the interposing unit 4. Upper external contact pads 6 are represented by circles on the upper surface 26 of the upper interposing unit 4, which at the same time forms the upper surface 8 of the basic semiconductor component 1. Overall, six rows of these external contact pads 6 are arranged in fifteen columns. The interposing structure on the upper surface 26 of the upper interposing unit 4, which has interposing lines from the upper external contact pads 6 to the bonding surfaces 12, cannot be seen in FIG. 11 because it is covered by an insulation layer 67 which leaves free only the bonding surfaces 12 in the edge areas 14 and the external contact pads 6 on the upper surface 26 of the upper interposing unit 4.

Spacers 22 are arranged on the lower surface 24 on two opposite edge areas 14 of the upper interposing unit 4 and support the upper interposing unit 4 in the area of the bonding surfaces 12, thus allowing reliable bonding once the upper interposing unit 4 and the lower interposing unit 3 have been moved together in the direction of the arrow 64. A semiconductor chip 19 is arranged in the centre on the lower interposing unit 3 such that its edge faces 27 and 28 are aligned with respect to the spacers 22 such that an opening remains free when the upper interposing unit 4 is lowered in the direction of the arrow 64, via which plastic housing compound can penetrate into the space between the upper interposing unit 4 and the lower interposing unit 3, and can embed the semiconductor chip 19 in plastic housing compound. In its edge areas 15, the lower interposing unit 3 has lower bonding surfaces 13 arranged in positions so as to correspond with the upper bonding surfaces 12 on the upper interposing unit 4. Furthermore, the lower interposing unit 3 has external contact pads 5, which are arranged on its lower surface 23, which, at the same time, is the lower surface 7 of the basic semiconductor component 1.

Figure 12:
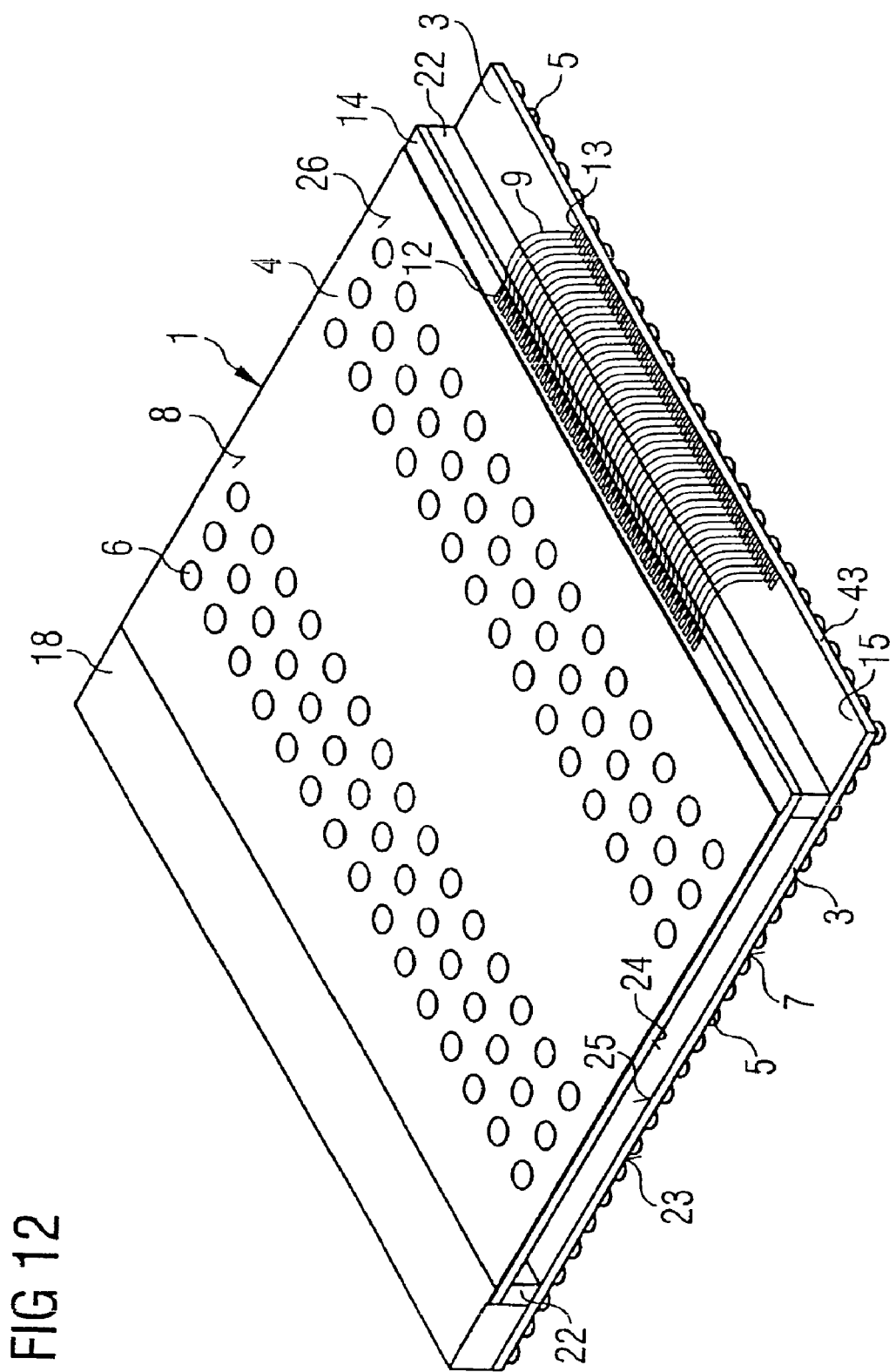
FIG. 12 shows a schematic and exploded view in perspective of a basic semiconductor component with bonding connections, some of which are still exposed, in accordance with the invention.

FIG. 12 shows a schematic view in perspective of a basic semiconductor component 1 with bonding connections 9, some of which are still exposed. Once the upper interposing unit 4, as is shown in FIG. 11, has been lowered onto the lower interposing unit 3, the bonding surfaces 13 are connected to the bonding surfaces 12, so that the external contact pads 5 on the lower surface 23 of the lower interposing unit 3 are connected to the external contact pads 6 via the upper bonding surfaces 12 and interposing lines, which cannot be seen, on the upper surface 26 of the upper interposing unit 4 for the upper external contact pads 6. The pattern of the external contact pads 6 on this basic semiconductor component 1 is matched to a customer-specific semiconductor component such that it is possible to stack on this basic semiconductor component 1.

Figure 13:
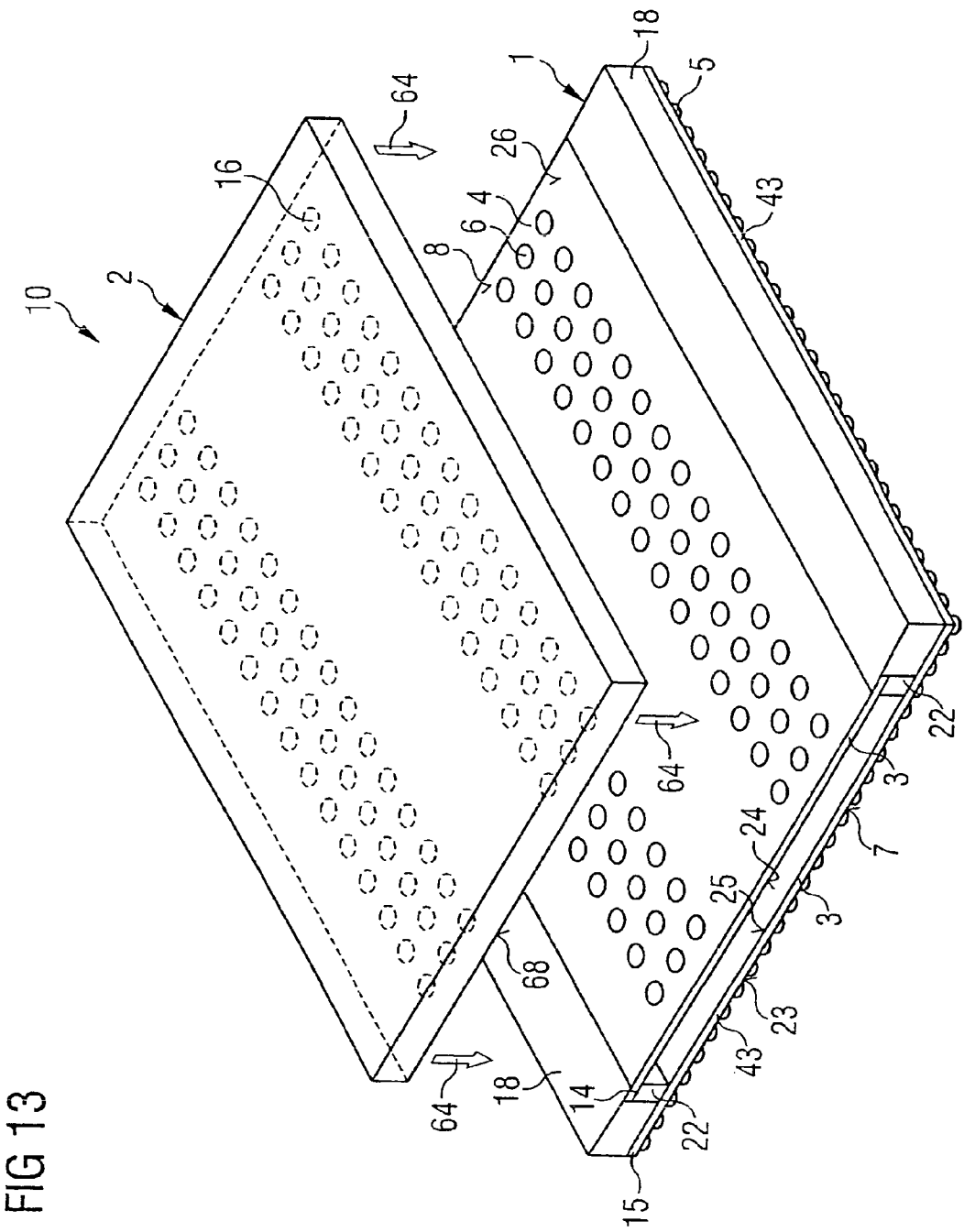
FIG. 13 shows a schematic and exploded view in perspective of a semiconductor module including a basic semiconductor component and a stacked component in accordance with the invention.

FIG. 13 shows a schematic, exploded view in perspective of a semiconductor module 10 comprising a basic semiconductor component 1 and a stacked semiconductor component 2. The stacked semiconductor component 2 is a semiconductor component with a so-called "ball grid array" as an external contact pattern, with the external contact pattern being arranged on the lower surface 68 of the semiconductor component 2. The corresponding upper external contacts 16, which are represented by dashed lines here, are arranged such that their surface is congruent to the upper external contact pads 6 on the upper interposing unit 4. When the semiconductor component 2 be stacked is lowered in the direction of the arrow 64 onto the basic semiconductor component 1, a semiconductor module is formed, which is distinguished by its small physical height, its variability and its reliability.

Figure 14:
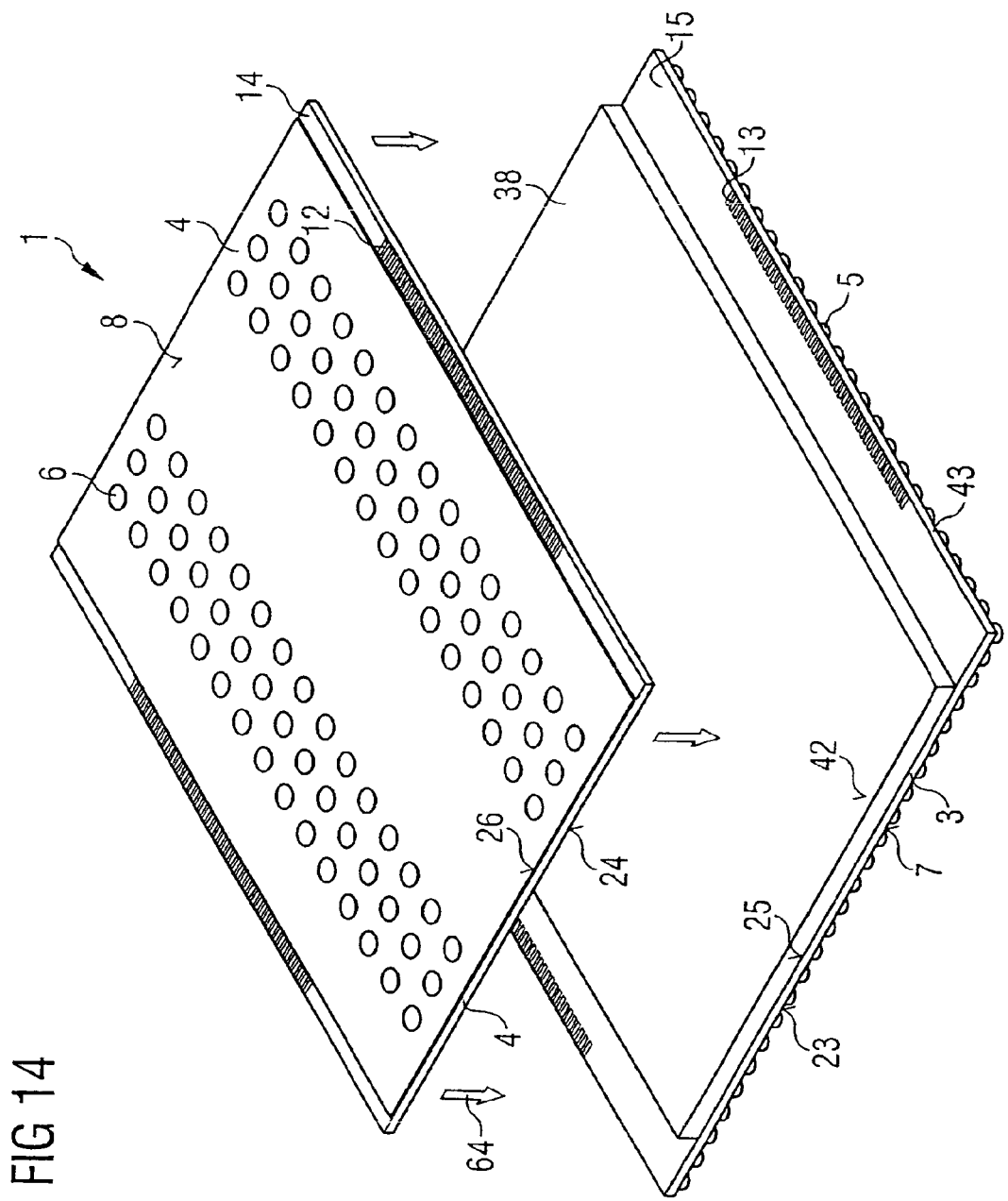
FIG. 14 shows a schematic and exploded view in perspective of a basic semiconductor component according to the third embodiment of the invention, as is shown in FIG. 3.

FIG. 14 shows a schematic, exploded view in perspective of a basic semiconductor component 1 according to the fourth embodiment of the invention, as is shown in FIG. 4. The individual components in FIG. 14 differ from the individual components in the example in FIG. 11 in that the area extent of the plastic housing 38 corresponds approximately to the upper interposing unit 4. There is therefore no need for any spacers in this embodiment of the invention. The entire upper interposing unit 4 can in consequence be adhesively bonded onto the upper surface 42 of the plastic housing 38. The plastic housing 38 also supports the upper interposing unit 4 during the connection of the upper bonding surfaces 12 to the lower bonding surfaces 13, and, in the process, absorbs bonding forces without loading the upper interposing unit 4.

Figure 15:
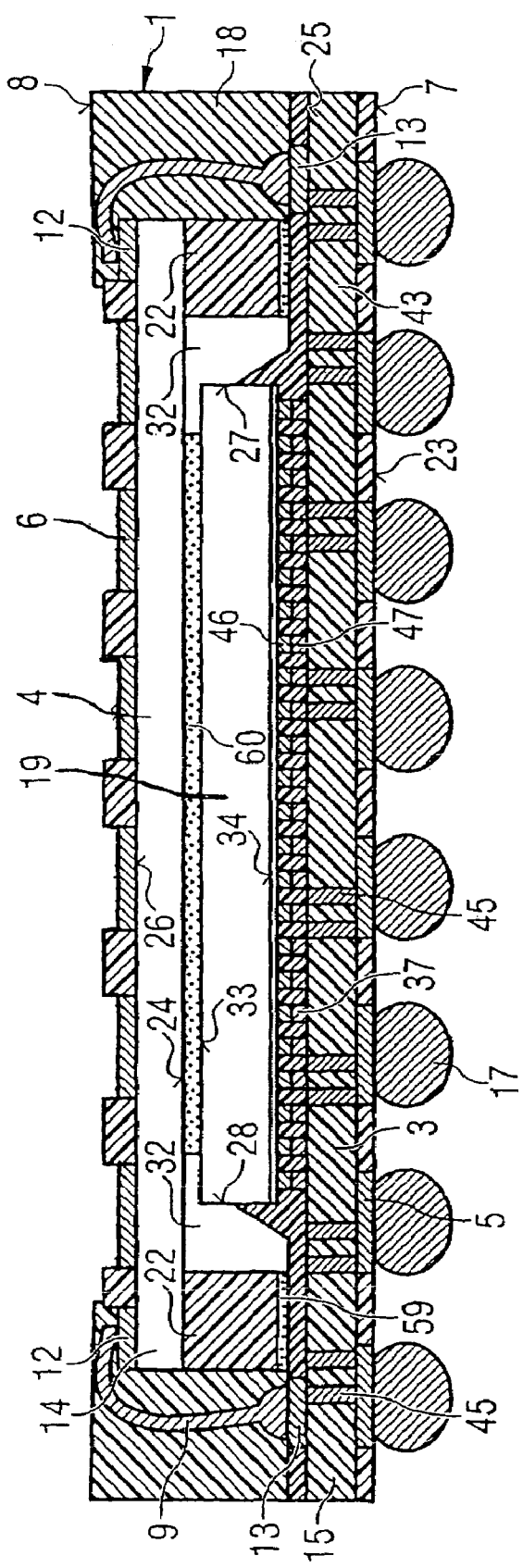
FIG. 15 shows a schematic cross-sectional view of a first embodiment of a basic semiconductor component in accordance with the invention.

FIG. 15 shows a schematic cross-sectional view of a first embodiment of a basic semiconductor component 1. This first variant uses the interposer as the upper interposing unit 4 with moulded spacers 22. This variant is preferably used as a basic semiconductor component 1 with a semiconductor chip 19 which has flipchip contacts 46. The flipchip contacts 46 are fit on contact connecting pads 47 on the lower interposing unit 3. Semiconductor chips 19 such as these with flipchip contacts 46 have a smaller area than the area which is required for the upper interposing unit 4, or for an interposer. The spacers 22 are used to support those areas in which wire bonding must be carried out, so that this allows a reliable bonding process. After wire bonding, the bonding channels are closed by means of an encapsulation process by means of moulding or dispensing, with the bonding connections 9 being embedded. This configuration, as is shown in FIG. 15, can also be produced by moulding or casting the spacers 22 on the lower interposing unit 3 of the basic semiconductor component I rather than on the upper interposing unit 4.

As FIG. 15 shows, the spacers 22 for the upper interposing unit 4 are fixed on the lower interposing unit 3 by means of an adhesive layer 59. The lower surface 24 of the upper interposing unit 4 is optionally connected to the semiconductor chip 19 via an adhesive layer 60.

In this first embodiment of the basic semiconductor component 1 as shown in FIG. 15, the semiconductor chip 19 is completely surrounded by the spacer 22 between the lower and the upper interposing units 3 and 4, respectively, thus forming a cavity 32 in the edge area between the semiconductor chip and the spacer. The plastic compound 18 which forms the housing and in which the bonding connections 9 are embedded does not fill this cavity 32, because the semiconductor chip 19 is completely surrounded by the spacer 22.

The external contacts 17 of the semiconductor module 10 are soldered in the form of solder balls on lower external contact pads 5 on the lower surface 23 and on the lower interposing unit 3. The upper external contact pads 6 on the upper interposing unit 4 of the basic semiconductor component 1 can be arranged on a customer-specific basis, and, in particular, the lower interposing unit 3 and the upper interposing unit 4 may be designed completely independently of one another.

The electrical connections within the basic semiconductor component 1, the upper external contact pads 6 and the lower external contacts 17 pass via subsequent interfaces and contacts, firstly via the flipchip contacts on the semiconductor chip 19, then via contact connecting pads on an interposing structure of the lower interposing unit 3. This interposing structure may have interconnects, which lead to vias 45 in the lower interposing unit 3, and correspond to the lower external contact pads 5 on the lower interposing unit 3.

At the same time, interposing lines on the upper surface 25 of the lower interposing unit 3 lead from the flipchip contacts 46 to bonding surfaces 13 on the lower interposing unit 3. These bonding surfaces 13 are arranged on the upper surface 25 in the edge areas 15 of the lower interposing unit 3, thus resulting in electrical connections via bonding connections 9 for the bonding surfaces 12 on the upper interposing unit 4. These bonding surfaces are in turn connected to the upper external contact pads 6 via an interposing structure, which cannot be seen, on the upper surface 26, of the upper interposing unit 4. This ensures that there are electrical connections from the flipchip contacts 46 on the semiconductor chip 19 both to the external contacts 17 on the lower surface of the basic semiconductor component 1 and to the external contact pads 6 on the upper surface of the basic semiconductor component.

With regard to variant 1 and the first embodiment of the basic semiconductor component 1, it should also be noted that production of the spacers 22 by means of a moulding process is an extremely cost-effective variant, in which a grid composed of a pressing compound is first of all moulded onto an interposing board or onto an interposer substrate strip. Once this has been done, the interposer substrate and the upper interposing unit are then separated by sawing.

Figure 16:
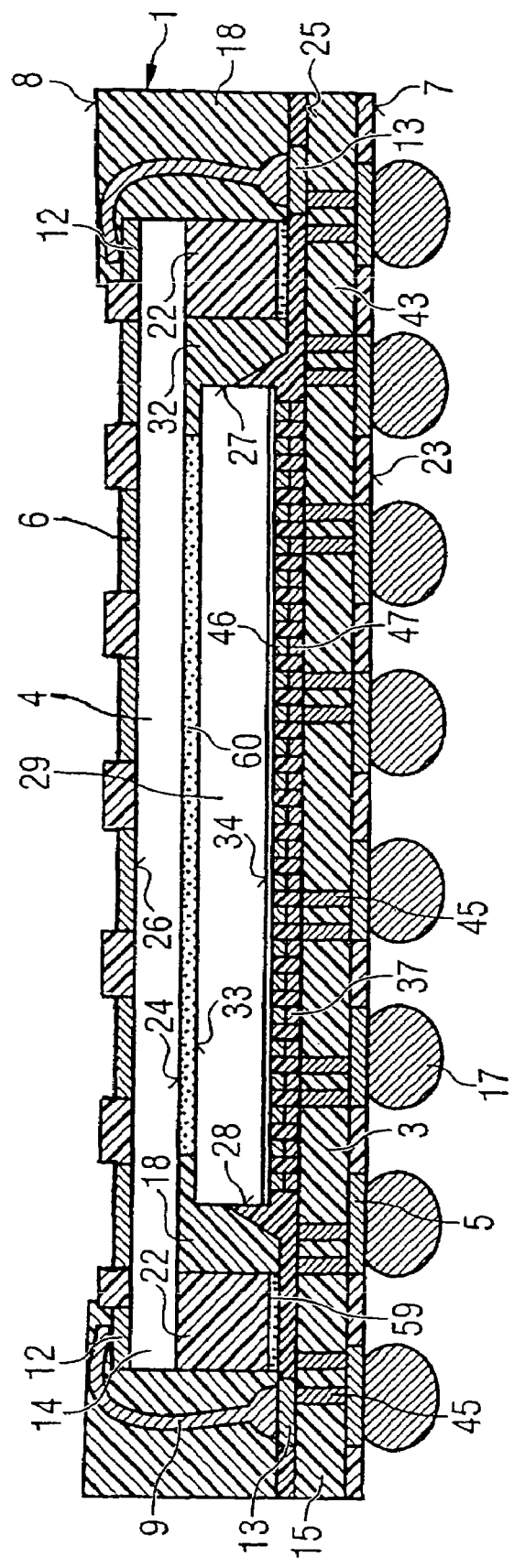
FIG. 16 shows a schematic cross-sectional view of a second embodiment of a basic semiconductor component in accordance with the invention.

FIG. 16 shows a schematic cross-sectional view of a second embodiment of a basic semiconductor component 1. Components with the same functions as in FIG. 15 are identified by the same reference symbols, and will not be explained again.

This second embodiment or second variant is similar to the first embodiment of the basic semiconductor component 1. However, in the second embodiment, the channels are not only encapsulated with the bonding wires located in them, with the bonding connections 9 thus being embedded in a plastic housing compound 18, but, instead, the cavities 32 (as can also be seen in FIG. 15) underneath the upper interposing board are also filled with the encapsulation compound, such as a plastic housing compound 18. This is achieved by the spacer 22 not completely surrounding the semiconductor chip 29 for the basic semiconductor component 1 but, in fact, being arranged only on the two opposite edge faces of the semiconductor chips 27 and 28, so that plastic housing compound 18 can penetrate into the cavities from the other edge faces, which are not shown here, and can fill them.

If the lower interposing unit 3 has a thickness of 100 to 150 micrometres and the upper interposing unit has a thickness of 80 to 130 micrometres, with the semiconductor chip 29 having a thickness of between 70 and 120 micrometres, this results in the basic semiconductor component 1 having an overall thickness or overall height of between 250 and 400 micrometres.

Figure 17:
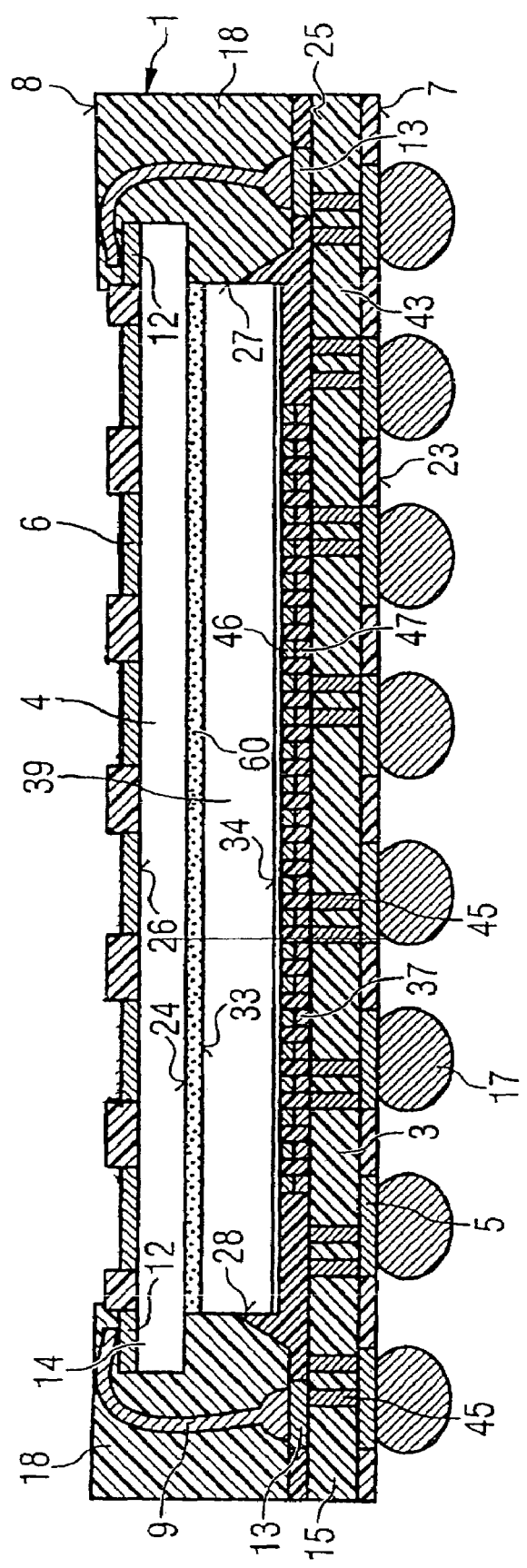
FIG. 17 shows a schematic cross-sectional view of a third embodiment of a basic semiconductor component in accordance with the invention.

FIG. 17 shows a schematic cross-sectional view of a third embodiment of a basic semiconductor component 1. Components having the same functions as in FIG. 15 are identified by the same reference symbols, and will not be explained again.

An upper interposing unit 4 or else interposer without any further spacers is used for the third variant or third embodiment of the basic semiconductor component 1. This variant can be used when the upper interposing unit 4 has an area which corresponds approximately to that of the semiconductor chip 39 between the upper interposing unit 4 and the lower interposing unit 3.

In this case, the forces which occur during production of the bonding connections 9 are absorbed by the semiconductor chip 39 itself in a supporting manner, so that the semiconductor chip 39 contributes to making the edge areas 14 of the upper interposing unit 4 (which have the bonding surfaces 12) robust during the bonding process. The plastic compound 18 which is introduced into the bonding channels in the lower interposing unit at the same time fills all the spaces between the upper interposing unit 4 and the lower interposing unit 3, thus resulting in a compact basic semiconductor component 1. The connection technique between the flipchip contacts 46 on the semiconductor chip 39 and the upper external contact pads 6 is such that they are connected to one another in the same way via two corresponding interposing structures on the lower and upper interposing units 3 and 4.

Figure 18:
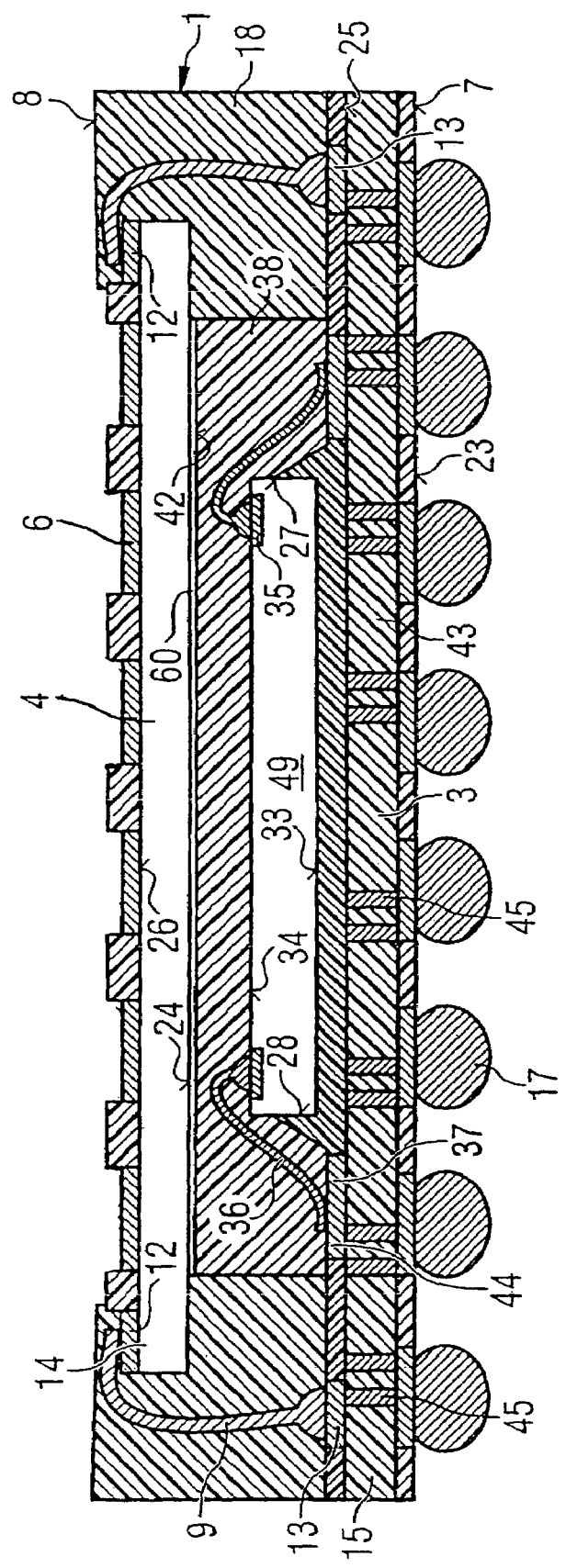
FIG. 18 shows a schematic cross-sectional view of a fourth embodiment of a basic semiconductor component in accordance with the invention.

FIG. 18 shows a schematic cross-sectional view of a fourth embodiment of a basic semiconductor component 1. Components having the same functions as in the previous FIGS. 15 to 17 are identified by the same reference symbols, and will not be explained again.

The fourth embodiment of the basic semiconductor component 1 represents a variant in which a plastic housing 38 is provided within the basic semiconductor component 1 in order to encapsulate a semiconductor chip 49 in the basic semiconductor component 1. An upper interposing unit 4 is fit to the upper surface 42 of this plastic housing 38. A further difference between the fourth embodiment of the basic semiconductor component 1 as shown in FIG. 18 and the previous embodiments is that the semiconductor chip 49 is adhesively bonded by its rear face onto the lower interposing unit 3, while its active upper surface 34 is connected by means of the contact pads 35 and via additional bonding connections 36 within the plastic housing 38 to corresponding bonding surfaces 44 on the interposing structure 37 on the upper surface 25 of the lower interposing unit 3.

These bonding surfaces 44 are also included in the plastic housing 38. This variant of the invention accordingly has wire-bonded semiconductor chips in a plastic housing 38 for the basic semiconductor component 1, although it is also possible to use flipchip contacts instead of a wire-bonded semiconductor chip. In the case of flipchip contacts, the active upper surface 34 is aligned with respect to the lower interposing unit 3 as shown in FIGS. 15 to 17. An adhesive layer 60, which fixes the upper interposing unit 4 on the plastic housing 38, is arranged between the plastic housing 38 for the semiconductor chip 49 and the upper interposing unit 4. The area extent of the plastic housing 38 is chosen such that it corresponds to the area of the upper interposing unit 4.

While the invention has been described in detail and with reference to specific embodiments thereof, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A semiconductor module comprising a semiconductor stack including a plurality of semiconductor components arranged in a vertically stacked orientation, the plurality of semiconductor components comprising a basic semiconductor component, the basic semiconductor component comprising:

an upper interposing unit including upper external contact pads disposed on an upper surface of the basic semiconductor component;

a lower interposing unit including lower external contact pads disposed on a lower surface of the basic semiconductor component;

a semiconductor chip disposed between the upper and lower interposing units, the upper interposing unit being mounted by a layer of adhesive which extends directly between a lower surface of the upper interposing unit and an upper surface of the semiconductor chip; and a spacer disposed between the upper and lower interposing units, the spacer comprising a plurality of raised ribs that are disposed on, and extend along an entire length of, opposite sides of the semiconductor chip, the spacer being comprised of plastic, wherein the external contact pads of the upper and lower interposing units are electrically connected via bonding connections comprising bond wires connected between bonding surfaces disposed in edge areas of the upper and lower interposing units, the external contact pads of the lower interposing unit include external contacts of the semiconductor module, and the external contact pads of the upper interposing unit are fit with external contact pads of a stacked semiconductor component.

2. The semiconductor module of claim 1, wherein the bonding connections are embedded in a plastic housing compound.

3. The semiconductor module of claim 1, wherein the spacer forms a housing and is cast onto a lower surface of the upper interposing unit, and the spacer is adhesively bonded to an upper surface on the lower interposing unit.

4. The semiconductor module of claim 3, wherein the spacer is disposed on edge surfaces of the basic semiconductor component and surrounds the semiconductor chip.

5. The semiconductor module of claim 3, wherein the spacer surrounds the semiconductor chip of the basic semiconductor component on two opposite edge faces.

6. The semiconductor module of claim 3, wherein a plastic housing compound is disposed between the spacer and the semiconductor chip of the basic semiconductor component.

7. The semiconductor module of claim 1, wherein the basic semiconductor component includes a semiconductor chip disposed between the upper and lower interposing units and including contact pads, the rear face of the semiconductor chip is arranged on the lower interposing unit, the contact pads of the semiconductor chip are disposed on an active upper surface of the semiconductor chip and are electrically connected via bonding connections of the semiconductor chip to bonding surfaces of an interposing structure on an upper surface of the lower interposing unit, the semiconductor chip and the bonding connections of the semiconductor chip are embedded in a plastic housing including an upper surface, and the upper interposing unit of the basic semiconductor component is disposed on the upper surface of the plastic housing.

8. The semiconductor module of claim 7, wherein the lower interposing unit includes an insulating mounting board including an upper surface, an interposing structure is disposed on the upper surface of the insulating mounting board and includes bonding surfaces on edge faces of the interposing structure to provide bonding connections with the semiconductor chip, wherein interposing lines extend from the bonding surfaces of the insulating mounting board to vias disposed along the mounting board at locations below a lower surface of the semiconductor chip, and wherein the vias are electrically connected to the external contact pads on the lower interposing unit.

9. The semiconductor module of claim 1, wherein the basic semiconductor component includes a semiconductor chip disposed between the upper and lower interposing units and including flipchip contacts, the flipchip contacts being electrically connected to contact connecting pads of an interposing structure disposed on an upper surface of the lower interposing unit.

10. The semiconductor module of claim 9, wherein the lower interposing unit includes an insulating mounting board with an upper surface, an interposing structure disposed on the upper surface of the insulating mounting board and including contact connecting pads that connect with the flipchip contacts on the semiconductor chip, the interposing structure further including interposing lines extending to bonding surfaces disposed along edge areas of the interposing structure and to vias disposed on the mounting board, and wherein the vias are electrically connected to the external contact pads on the lower interposing unit.

11. The semiconductor module of claim 1, wherein the upper interposing unit comprises a spacing structure that forms a housing that surrounds at least a portion of the semiconductor chip, the spacing structure comprising a plurality of raised ribs disposed on a second surface of the upper interposing unit that opposes a first surface and corresponds with edge areas of the upper interposing unit.

12. The semiconductor module of claim 1, wherein the raised ribs of the spacer surround the semiconductor chip on all four sides thereof.

13. A semiconductor module comprising a semiconductor stack including a plurality of semiconductor components arranged in a vertically stacked orientation, the plurality of semiconductor components comprising a basic semiconductor component, the basic semiconductor component comprising:

an upper interposing unit including upper external contact pads disposed on an upper surface of the basic semiconductor component; and a lower interposing unit including lower external contact pads disposed on a lower surface of the basic semiconductor component;

wherein the external contact pads of the upper and lower interposing units are electrically connected via bonding connections between bonding surfaces disposed in edge areas of the upper and lower interposing units, the external contact pads of the lower interposing unit include external contacts of the semiconductor module, and the external contact pads of the upper interposing unit are fit with external contact pads of a stacked semiconductor component, wherein the basic semiconductor component includes a semiconductor chip disposed between the upper and lower interposing units, wherein the basic semiconductor component includes a spacer being comprised of plastic and disposed between the upper and lower interposing units, the spacer forms a housing and is cast onto a lower surface of the upper interposing unit, and the spacer is adhesively bonded to an upper surface on the lower interposing unit, and wherein the basic semiconductor component includes a cavity disposed between the semiconductor chip and the spacer.

14. The semiconductor module of claim 13, wherein the spacer has a closed grid structure that is configured to surround the semiconductor chip on all four sides thereof.

15. An interposing board comprising: a plurality of interposing positions, the interposing positions being arranged in rows and columns and including metallic interposing structures with external contact pads disposed in the interposing positions on a first surface of the interposing board, a spacing structure that forms a housing that surrounds at least a portion of each of the interposing positions, the spacing structure comprising a plurality of raised ribs and/or a raised grid structure disposed on a second surface of the interposing board that opposes the first surface and corresponds with edge areas of the interposing positions, wherein the raised ribs and/or a raised grid structure is comprised of a plastic housing composition.

16. A semiconductor module comprising a semiconductor stack including a plurality of semiconductor components arranged in a vertically stacked orientation, the plurality of semiconductor components comprising a basic semiconductor component, the basic semiconductor component comprising:
- an upper interposing unit including upper external contact pads disposed on an upper surface of the basic semiconductor component;
- a lower interposing unit including lower external contact pads disposed on a lower surface of the basic semiconductor component;
- a semiconductor chip disposed between the upper and lower interposing units, the upper interposing unit being mounted by a layer of adhesive which extends directly between a lower surface of the upper interposing unit and plastic housing composition in which the semiconductor chip is embedded; and
- a spacer disposed between the upper and lower interposing units, the spacer comprising a plurality of raised ribs that are disposed on, and extend along an entire length of, opposite sides of the semiconductor chip, the spacer being comprised of plastic,
- wherein the external contact pads of the upper and lower interposing units are electrically connected via bonding connections comprising bond wires connected between bonding surfaces disposed in edge areas of the upper and lower interposing units, the external contact pads of the lower interposing unit include external contacts of the semiconductor module, and the external contact pads of the upper interposing unit are fit with external contact pads of a stacked semiconductor component.

17. The semiconductor module of claim 16, wherein the raised ribs of the spacer surround the semiconductor chip on all four sides thereof.

18. A module comprising a plurality of components arranged in a vertically stacked orientation, the plurality of components comprising a basic component, the basic component comprising:
- an upper interposing unit including upper external contact pads disposed on an upper surface of the basic component;
- a lower interposing unit including lower external contact pads disposed on a lower surface of the basic component;
- an electronic module disposed between the upper and lower interposing units, the upper interposing unit being mounted by a layer of adhesive which extends directly between a lower surface of the upper interposing unit and an upper surface of the electronic module; and
- a spacer disposed between the upper and lower interposing units, the spacer comprising a plurality of raised ribs that are disposed on, and extend along an entire length of, opposite sides of the electronic module, the spacer being comprised of plastic,
- wherein the external contact pads of the upper and lower interposing units are electrically connected via bonding connections comprising bond wires connected between bonding surfaces disposed in edge areas of the upper and lower interposing units, the external contact pads of the lower interposing unit include external contacts of the module, and the external contact pads of the upper interposing unit are fit with external contact pads of a stacked component.

19. The module of claim 18, wherein the raised ribs of the spacer surround the electronic module on all four sides thereof.

* * * * *